United States Patent
Francis et al.

(10) Patent No.: US 6,603,153 B2
(45) Date of Patent: Aug. 5, 2003

(54) FAST RECOVERY DIODE AND METHOD FOR ITS MANUFACTURE

(75) Inventors: Richard Francis, Manhattan Beach, CA (US); Chiu Ng, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/862,017

(22) Filed: May 21, 2001

(65) Prior Publication Data

US 2002/0008246 A1 Jan. 24, 2002

Related U.S. Application Data

(62) Division of application No. 09/593,333, filed on Jun. 14, 2000.

(51) Int. Cl.⁷ .................... H01L 29/861; H01L 29/88
(52) U.S. Cl. ................ 257/104; 257/106; 257/107; 257/121; 257/143; 257/149; 257/175; 257/528; 257/551; 257/601; 257/656; 257/910
(58) Field of Search ................ 257/910, 656, 257/149, 121, 143, 551, 603, 604, 528, 601, 104, 106, 107, 109, 175

(56) References Cited

U.S. PATENT DOCUMENTS

| | | | | |
|---|---|---|---|---|
| 3,852,120 A | * | 12/1974 | Johnson et al. | 438/474 |
| 4,210,464 A | * | 7/1980 | Tanaka et al. | 438/778 |
| 5,001,537 A | * | 3/1991 | Colman et al. | 257/173 |
| 5,081,509 A | * | 1/1992 | Kozaka et al. | 257/106 |
| 5,430,311 A | * | 7/1995 | Murakami et al. | 257/146 |
| 5,479,031 A | * | 12/1995 | Webb et al. | 257/173 |
| 5,552,625 A | * | 9/1996 | Murakami et al. | 257/409 |
| 5,682,044 A | * | 10/1997 | Tamamushi et al. | 257/147 |
| 5,739,732 A | * | 4/1998 | Kit | 333/172 |
| 5,859,446 A | * | 1/1999 | Nagasu et al. | 257/174 |
| 5,880,513 A | * | 3/1999 | Temple et al. | 257/539 |
| 5,981,984 A | | 11/1999 | Iwaana et al. | |
| 6,120,749 A | * | 9/2000 | Takano et al. | 423/348 |
| 6,168,981 B1 | | 1/2001 | Battaglia et al. | |
| 6,274,892 B1 | | 8/2001 | Kub et al. | |
| 6,441,455 B1 | * | 8/2002 | Dutta | 257/490 |
| 2001/0012649 A1 | * | 8/2001 | Toshida et al. | 438/149 |
| 2003/0006425 A1 | * | 1/2003 | Bol et al. | 257/127 |

OTHER PUBLICATIONS

International Search Report dated Feb. 6, 2002 from the International Searching Authority for corresponding PCT Appln. No. PCT/US01/17381.

* cited by examiner

Primary Examiner—Amir Zarabian
Assistant Examiner—Ida M. Soward
(74) Attorney, Agent, or Firm—Ostrolenk, Faber, Gerb & Soffen, LLP

(57) ABSTRACT

A soft recovery diode is made by first implanting helium into the die to a location below the P/N junction and the implant annealed. An E-beam radiation process then is applied to the entire wafer and is also annealed. The diode then has very soft recovery characteristics without requiring heavy metal doping.

4 Claims, 1 Drawing Sheet

FIG. 4 LIFETIME

FAST RECOVERY DIODE AND METHOD FOR ITS MANUFACTURE

CROSS REFERENCE TO RELATED APPLICATIONS

This is a divisional of U.S. patent application Ser. No. 09/593,333, filed Jun. 14, 2000 in the name of Richard Francis and Chiu Ng and entitled FAST RECOVERY DIODE AND METHOD FOR ITS MANUFACTURE.

FIELD OF THE INVENTION

This invention relates to semiconductor diodes and more specifically relates to a novel fast recovery diode (FRD) with ultra-soft turn off characteristics.

BACKGROUND OF THE INVENTION

Fast recovery diodes are frequently used in motor control and power supply circuits having an inductive load. It is desirable that such FRDs have a "soft" recovery characteristic; that is, that its di/dt during turn off is limited to reduce the production of high voltage spikes in the inductive load circuit.

FRDs with soft recovery characteristics are described in U.S. Pat. No. 5,747,872 dated May 5, 1998. Those devices employ typical heavy metal doping, for example, gold or platinum, in selective areas of the semiconductor die to reduce lifetime in that area.

Heavy metal doping introduces complex processing steps and is not well controlled. Devices employing heavy metal doping also have a high negative temperature coefficient and are not easily connected in parallel. Further, the use of heavy metal in wafer fabrication facilities can adversely affect the processing operation in other portions of the facility.

It would be desirable to produce an ultra-soft recovery FRD diode in which lifetime in selected regions of the die is limited without the need for heavy metal doping.

BRIEF DESCRIPTION OF THE INVENTION

In accordance with the invention, a novel ultra-soft FRD device and process of its manufacture is provided which excludes heavy metal from the process and employs only a helium implant and E-beam irradiation in the process, creating a desired gradient of lifetime of minority carriers in the silicon.

In particular, after the formation of the top surface of the die (or wafer containing plural die), helium is implanted into the front surface of the die to a given depth, preferably about 20 microns. This implant may be followed by an anneal at about 350° C. This is followed by E-beam radiation over the full surface (to control the "tail" characteristic), followed by an anneal at about 300° C.

The helium implant dose is in the range of about 5E9 to 2E11/cm$^2$ and is preferably about 9E10 ions/cm$^2$ and creates localized vacancies at a depth within the silicon, preferably slightly removed from the P/N junction of the device. A subsequent E-beam radiation is carried out at about 32kGray.

The final device is rated typically at 5 to 100 amperes at 1200 volts blocking. The device has a very soft recovery characteristic, making it ideal for use with motor control circuits.

DETAILED DESCRIPTION OF THE DRAWINGS

Figure 1:
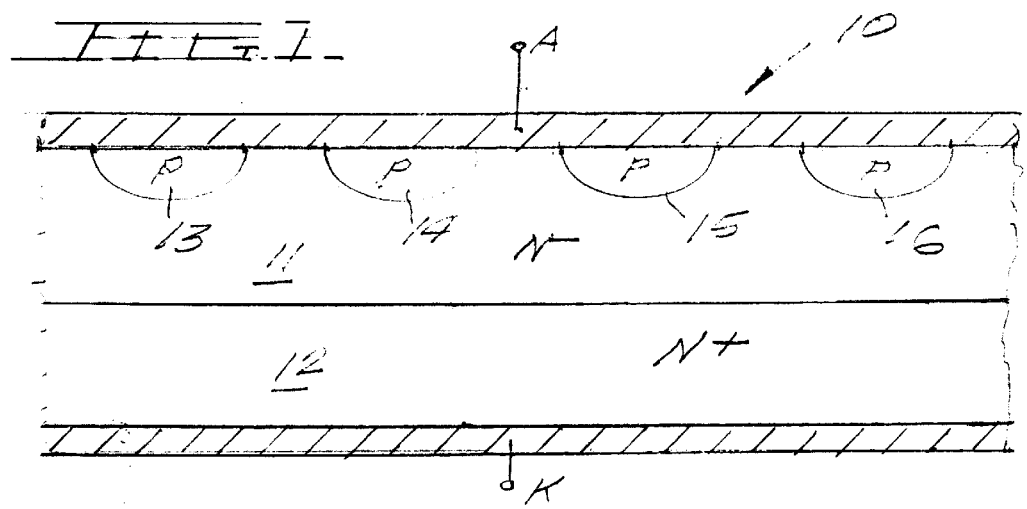
FIG. 1 is a cross-section through a small portion of the active area of a FRD structure.

Referring first to FIG. 1, there is shown a cross-section of a small portion of a cellular FRD device in which a silicon die 10 has an $N^{31}$ epitaxial layer 11 formed atop an $N^{30}$ body 12. $N^{30}$ layer 12 could also be a diffused layer if desired. A plurality of spaced P diffusions 13, 14, 15 and 16, are provided which are polygonal in topology. However, these diffusions may be spaced parallel elongated stripes.

A top aluminum anode contact 20 is sputtered or otherwise formed on the upper surface of layer 11 so that its contact to P regions 13 to 16 forms a respective P/N diode while its contact to the $N^{31}$ silicon surface between the P diffusions forms a Schottky diode.

By using a sufficiently large area and cooling, and by appropriately adjusting the $N^{31}$ concentration and thickness, the device can typically be made to carry up to 100 amperes in a forward direction with a forward voltage drop of less of about 2 volts at full forward current. The device can typically withstand about 1200 volts in the reverse blocking direction. These characteristics are useful for motor control circuits in which the device is typically connected in parallel with a power MOSFET or IGBT used to control the output to the motor. However, because such devices may have a high dIreverse/dt during turn off, a high voltage spike can be induced in an inductive circuit during diode turn off.

Figure 3:
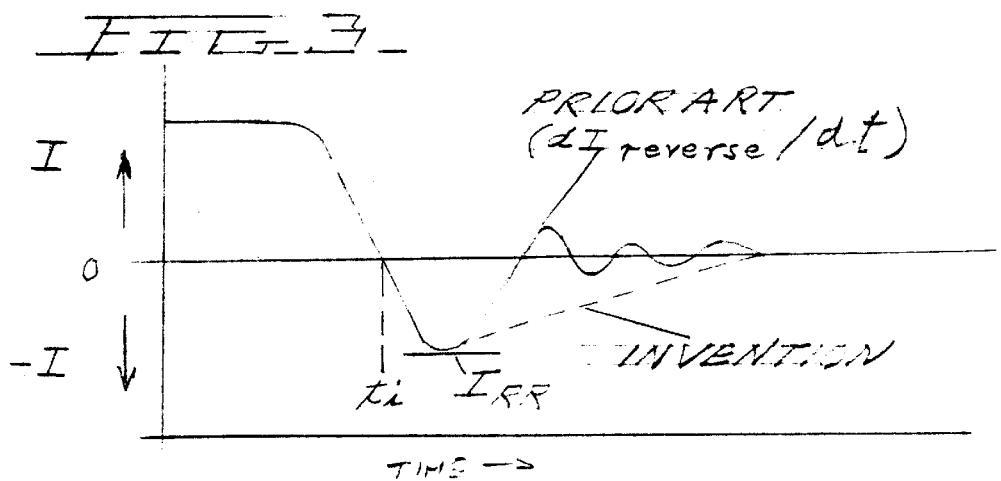
FIG. 3 illustrates the soft recovery characteristics produced by the invention.

In accordance with the present invention, the lifetime of the silicon beneath and near the P/N junction is reduced, thus producing an ultra-soft turn off characteristic as shown in FIG. 3. FIG. 3 shows, in solid line, the current in the diode of FIG. 1 during turn off. Thus, the current I reverses through zero at time $T_1$ and has a sharp slope (or snap back) through zero current with a high dIrec/dt, which will induce a high voltage spike in an inductive circuit.

In accordance with the invention, the recovery characteristic of the diode is made ultra-soft, as indicated by dotted lines in FIG. 3. This characteristic has a much reduced dIrec/dt so that a smaller voltage will be induced in an inductive circuit. Further, this is accomplished without the use of heavy metal lifetime killing processes.

Figure 2:
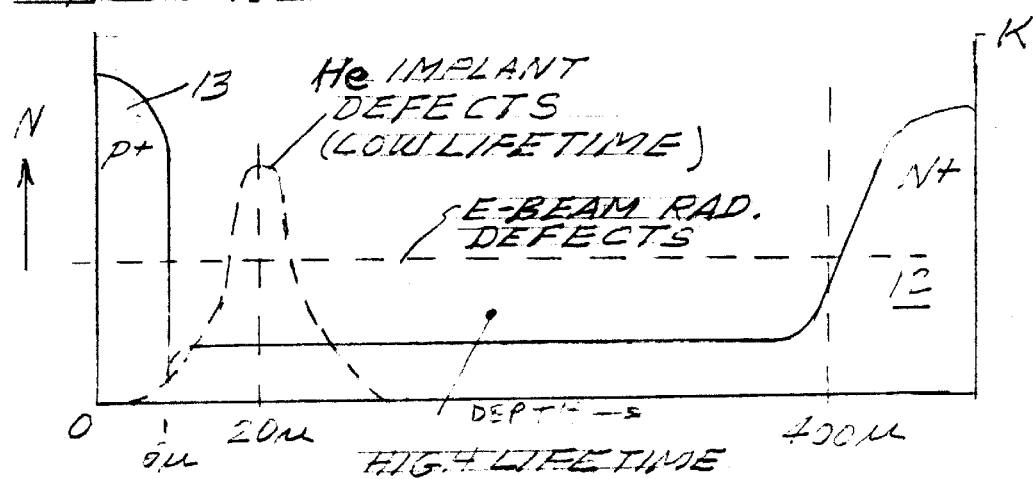
FIG. 2 is a diagram of the doping concentration and defect location in the device of FIG. 1, in accordance with the invention.

More specifically, as shown in FIG. 2, the $P^{30}$ region 13 and $N^{30}$ region 12 are illustrated, plotting the number of donor/receptor atoms versus depth from the top of the chip.

A first helium implant takes place to implant helium, as shown in dotted lines. The implant is distributed over a depth of about 10 to 30 microns and has a peak located at a depth of from about 15 to 25 microns, and preferably 20 microns from the top surface of die 10 and below diffusions 13 to 16 (which are about 6 microns deep). The helium implant is at a dose of about 5E9 to 2E11 atoms/cm$^2$ and is preferably about 9E10 to a depth of 10$\mu$ to 30$\mu$, preferably 20$\mu$ below the silicon surface. The implant is then annealed at 350° C. for 30 to 60 minutes.

This implant creates defects in the silicon lattice which will reduce lifetime in that critical area.

An E-beam radiation step is next carried out at about 32kGray to 64kGray, to create further but uniformly distributed defects over the full volume of the silicon.

The E-beam radiation step is then annealed at 300° C. for 30–80 minutes.

The final diode has a very soft reverse recovery characteristic, as shown in FIG. 3. Further, by avoiding heavy metal, the process is more controllable and the device will not have a negative temperature coefficient so that identical devices are easily connected in parallel.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An ultra-soft recovery diode comprising:

a wafer of silicon of one conductivity type;

a plurality of spaced diffusions of the other conductivity type into the top surface of said wafer;

an anode contact overlying and contacting said diffusions and the silicon in the spaces between said diffusions;

a cathode contact on the bottom surface of said wafer;

a helium implant having a peak located immediately below said plurality of spaced diffusions to create defects which reduce minority carrier lifetime in that area;

and E-beam induced defects uniformly distributed over the full volume of said wafer;

said wafer being free of intentional heavy metal lifetime killing atoms.

2. The device of claim 1, wherein said helium implant has a dose of from 5E9 to $2E11/cm^2$ and has a depth of from 10 to 30 microns from the anode surface of said wafer.

3. A diode comprising:

a wafer of silicon of one conductivity type;

at least one diffusion of the other conductivity type formed into a portion at the top surface of said wafer;

a first main contact formed atop said wafer and contacting both said diffusion and a portion of said one conductivity type of said wafer;

a second main control on the bottom surface of said wafer;

a helium implant having a peak located immediately below said at least one diffusion to create defects which reduce minority carrier lifetime;

and a beam induced defects uniformly distributed over the full volume of said wafer;

said wafer being free of intentional heavy metal lifetime killing atoms.

4. The device of claim 3, wherein said helium implant has a dose of from 5E9 to $2E11/cm^2$ and has a depth of from 10 to 30 microns from the anode surface of said wafer.

* * * * *